United States Patent
Wan et al.

(10) Patent No.: US 11,705,409 B2
(45) Date of Patent: Jul. 18, 2023

(54) SEMICONDUCTOR DEVICE HAVING ANTENNA ON CHIP PACKAGE AND MANUFACTURING METHOD THEREOF

(71) Applicant: Taiwan Semiconductor Manufacturing Co., Ltd., Hsinchu (TW)

(72) Inventors: Albert Wan, Hsinchu (TW); Ching-Hua Hsieh, Hsinchu (TW); Chao-Wen Shih, Hsinchu County (TW); Han-Ping Pu, Taichung (TW); Meng-Tse Chen, Pingtung County (TW); Sheng-Hsiang Chiu, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 248 days.

(21) Appl. No.: 16/916,066

(22) Filed: Jun. 29, 2020

(65) Prior Publication Data

US 2020/0335459 A1 Oct. 22, 2020

Related U.S. Application Data

(62) Division of application No. 15/965,995, filed on Apr. 30, 2018, now Pat. No. 10,741,508.

(51) Int. Cl.
*H01L 23/66* (2006.01)
*H01L 23/522* (2006.01)
*H01L 23/31* (2006.01)
*H01L 21/56* (2006.01)

(52) U.S. Cl.
CPC .......... *H01L 23/66* (2013.01); *H01L 21/565* (2013.01); *H01L 23/3114* (2013.01); *H01L 23/5226* (2013.01); *H01L 2223/6677* (2013.01)

(58) Field of Classification Search
None
See application file for complete search history.

(56) References Cited

U.S. PATENT DOCUMENTS

| | | | |
|---|---|---|---|
| 7,618,846 B1 * | 11/2009 | Pagaila | H01L 24/19 257/E21.599 |
| 8,816,906 B2 * | 8/2014 | Kamgaing | H01L 25/16 342/368 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |

(Continued)

FOREIGN PATENT DOCUMENTS

WO  WO2018/125240  *  7/2018 ............ H01L 23/66

*Primary Examiner* — Bilkis Jahan
(74) *Attorney, Agent, or Firm* — JCIPRNET

(57) ABSTRACT

A semiconductor device including a chip package, a dielectric structure, and a first antenna pattern is provided. The dielectric structure is disposed on the chip package and includes a cavity and a vent in communication with the cavity. The first antenna pattern is disposed on the dielectric structure, wherein the chip package is electrically coupled to the first antenna pattern, and the cavity of the dielectric structure is disposed between the chip package and the first antenna pattern.

20 Claims, 20 Drawing Sheets

(56) References Cited

U.S. PATENT DOCUMENTS

| | | | |
|---|---|---|---|
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2010/0164671 A1* | 7/2010 | Pagani | H01L 29/82 336/200 |
| 2010/0190464 A1* | 7/2010 | Chen | H01L 23/66 438/106 |
| 2010/0327068 A1* | 12/2010 | Chen | G06K 19/07749 235/492 |
| 2016/0049723 A1* | 2/2016 | Baks | H01Q 19/10 343/848 |
| 2017/0186726 A1* | 6/2017 | Tang | H01L 25/16 |
| 2019/0116670 A1* | 4/2019 | Anderson | H01Q 1/2283 |
| 2019/0288382 A1* | 9/2019 | Kamgaing | H01Q 21/22 |

* cited by examiner

SEMICONDUCTOR DEVICE HAVING ANTENNA ON CHIP PACKAGE AND MANUFACTURING METHOD THEREOF

CROSS-REFERENCE TO RELATED APPLICATION

This application is a divisional application of and claims the priority benefit of a prior application Ser. No. 15/965,995, filed on Apr. 30, 2018. The entirety of each of the above-mentioned patent applications is hereby incorporated by reference herein and made a part of this specification.

BACKGROUND

Semiconductor devices and integrated circuits are used in a variety of electronic applications, such as personal computers, cell phones, digital cameras, and other electronic devices. As the demand for shrinking electronic devices has grown, a need for smaller and more creative packaging techniques of semiconductor devices has emerged. Thus, packages such as wafer-level packaging (WLP) have begun to be developed. For example, the dies of the wafer may be processed and packaged with other semiconductor devices (e.g. antenna) at the wafer-level. In addition, since the demand of modern communication for more bandwidth, high performance package designs with integrated antenna are desired.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
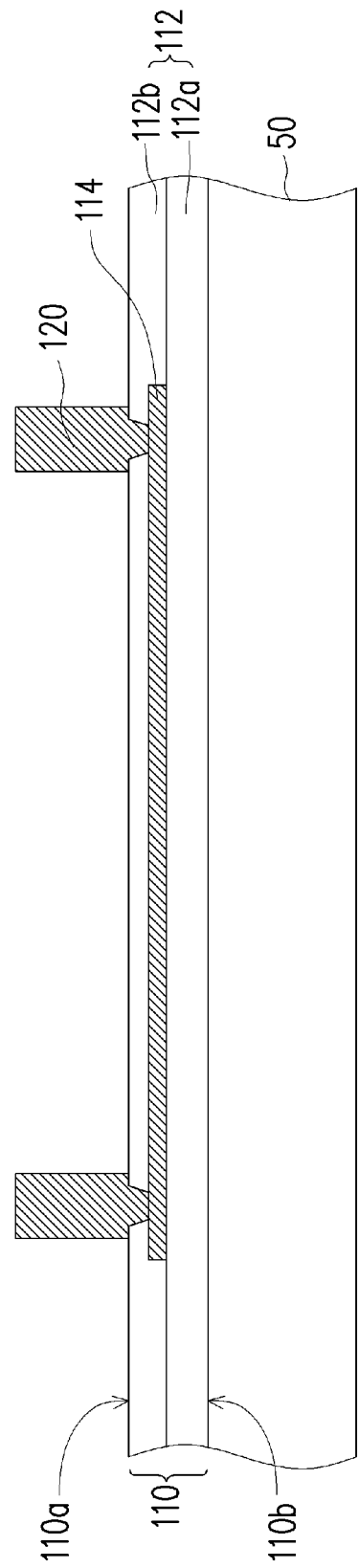
FIG. 1A to FIG. 1F are schematic cross-sectional views of various stages of manufacturing a chip package in accordance with some exemplary embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1F are schematic cross-sectional views of various stages of manufacturing a chip package in accordance with some exemplary embodiments of the disclosure. Referring to FIG. 1A, a temporary carrier 50 is provided, and a first redistribution layer 110 may be formed on the temporary carrier 50. In some embodiments, the temporary carrier 50 is a glass substrate. Other suitable carrier material may be adapted as the temporary carrier 50 as long as the material (e.g., metal, ceramic, plastic, etc.) is able to withstand the subsequent processes while carrying the device structure formed thereon. The first redistribution layer 110 has a first surface 110a and a second surface 110b opposite to the first surface 110a. At this stage, the first surface 110a faces upwardly, and the second surface 110b is attached to the temporary carrier 50. In some embodiments, the first redistribution layer 110 includes a first dielectric layer 112 and a first conductive pattern layer 114. For example, a dielectric layer 112a, the first conductive pattern layer 114, and a dielectric layer 112b are sequentially formed on the temporary carrier 50. The dielectric layer 112b formed on the first conductive pattern layer 114 may include a plurality of openings exposing at least a portion of the first conductive pattern layer 114. In some embodiments, the dielectric layers 112a and 112b are made of the same material, so the dielectric layers 112a and 112b can be collectively referred to as the first dielectric layer 112. In some embodiments, the first dielectric layer 112 may be a polymer layer made of polybenzoxazole (PBO), polyimide (PI), benzocyclobutene (BCB), a combination thereof, or the like.

In some embodiments, the first conductive pattern layer 114 formed on the dielectric layer 112b may include feed lines and a ground plane (not shown). For example, the feed lines of the first conductive pattern layer 114 may be electrically connected to other subsequently formed conductive elements for signal transmission and the ground plane may be electrically connected to a ground. In some embodiments, the first conductive pattern layer 114 includes copper, nickel, titanium, a combination thereof, or the like. In some embodiments, a de-bonding layer (not shown) may be provided between the first dielectric layer 112 and the temporary carrier 50. The de-bonding layer may be a light-to-heat conversion (LTHC) release layer and may aid the removal of the temporary carrier 50 in the subsequent processes. It should be noted that the number of the dielectric layers 112a, 112b and/or the first conductive pattern layer 114 is not limited by the illustration presented in FIG. 1A. In some alternative embodiments, more dielectric layers and/or more conductive pattern layers may be formed to stack alternately.

A plurality of through interlayer vias (TIV) 120 are formed on the first conductive pattern layer 114 exposed by the openings of the dielectric layer 112b. In some embodiments, the method of forming the TIVs 120 may at least include the following steps. A seed layer (not shown) may be conformally formed on the dielectric layer 112b. In some embodiments, the seed layer includes a titanium/copper bilayer, and is formed by a sputtering process. Thereafter, a photoresist layer (not shown) with openings is formed on the seed layer, and the openings of the photoresist layer expose the intended locations for the subsequently formed TIVs 120. Afterwards, a plating process is performed to form a metal material layer (e.g., a copper layer) on the seed layer exposed by the openings of the photoresist layer. The photoresist layer and the underlying seed layer are then removed to form the TIVs 200a. In some embodiments, some of the TIVs 120 may be arranged to form dipole antennas (not shown).

Figure 1B:
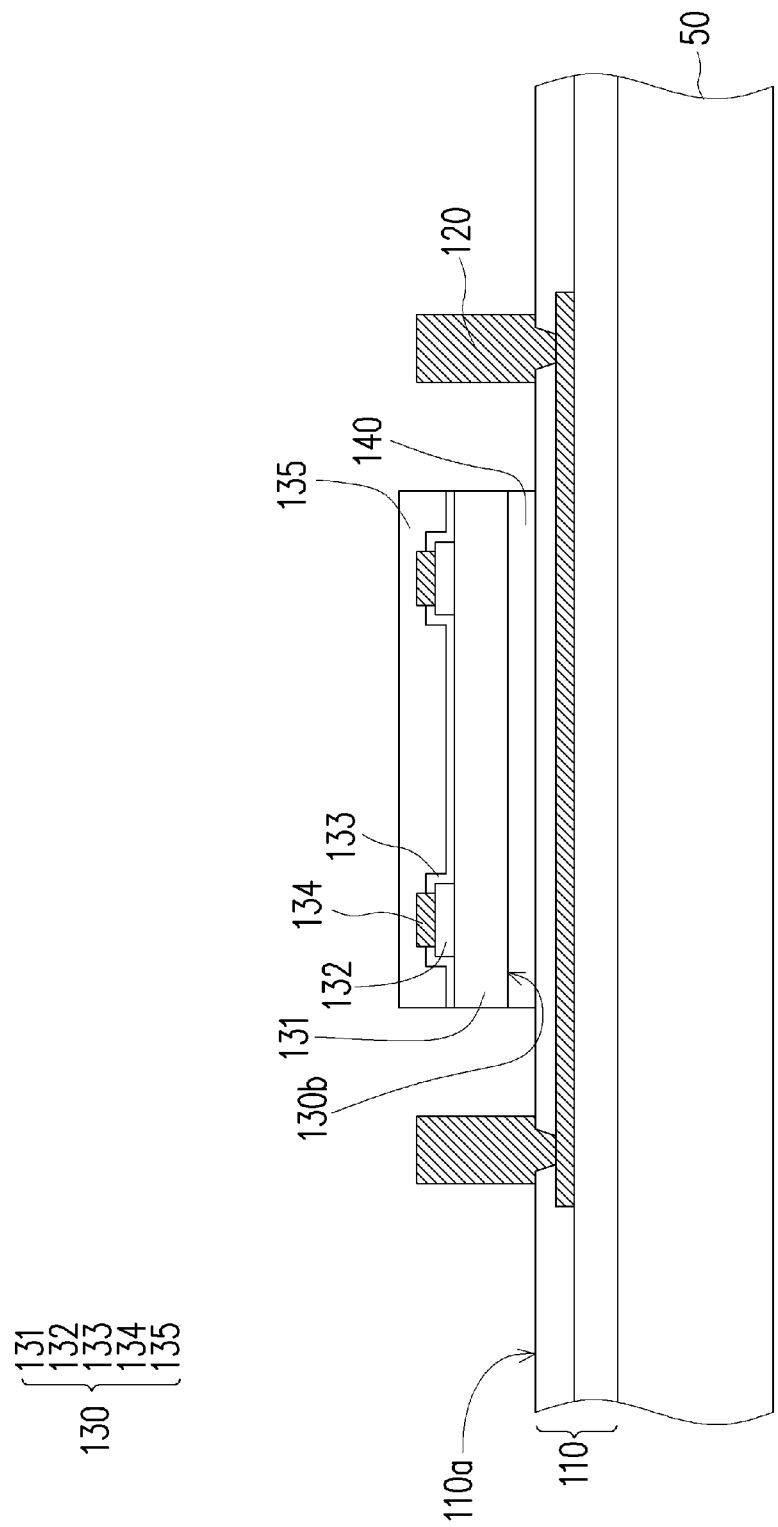

Referring to FIG. 1B, a chip 130 (or integrated circuit components) may be picked and placed on the first surface 110a of the first redistribution layer 110. In some embodiments, the chip 130 may be picked and placed on the first dielectric layer 112 after the formation of the TIVs 120. However, the disclosure is not limited thereto. In some alternative embodiments, the chip 130 may be picked and placed on the first dielectric layer 112 before the formation of the TIVs 120. In some embodiments, a rear surface 130b of the chip 130 is attached to a die attach film 140. For example, the chip 130 is attached (or adhered) on the first dielectric layer 112 through the die attach film 140. In some embodiments, the feed lines and/or the ground plane of the first conductive pattern layer 114 extend over the rear surface 130b of the chip 130.

For example, the chip 130 includes a semiconductor substrate 131, a plurality of conductive pads 132, a passivation layer 133, a plurality of conductive pillars 134, and a protection layer 135. In some embodiments, the conductive pads 132 are disposed over the semiconductor substrate 131. The semiconductor substrate 131 may be a silicon substrate including active components (e.g., transistors or the like) and passive components (e.g., resistors, capacitors, inductors or the like) formed therein. The passivation layer 133 may include a silicon oxide layer, a silicon nitride layer, a silicon oxy-nitride layer, a polyimide (PI) layer, a polybenzoxazole (PBO) layer, or a dielectric layer formed by other suitable dielectric materials. The passivation layer 133 may have a plurality of contact openings. The conductive pads 132 may be partially exposed by the contact openings of the passivation layer 133. The conductive pillars 134 may be formed in the contact openings of the passivation layer 133. In some embodiments, the conductive pillars 134 are plated on the conductive pads 132 to electrically and physically connect the conductive pads 132. The protection layer 135 may be formed on the passivation layer 133 to cover the conductive pillars 134.

In some embodiments, the chip 130 may be a radio frequency (RF) integrated circuit chip. In some alternative embodiments, the chip 130 may be application-specific integrated circuit (ASIC) chips, sensor chips, MEMS chips, or other suitable types of chips. The disclosure is not limited thereto. As shown in FIG. 1B, only one chip 130 is presented for illustrative purposes; however, it should be noted that the number of the chip can be one or more, the disclosure is not limited thereto. In certain embodiments, additional chip(s) may be provided, and the additional chip(s) and the chip 130 may be the same type or different types.

Figure 1C:
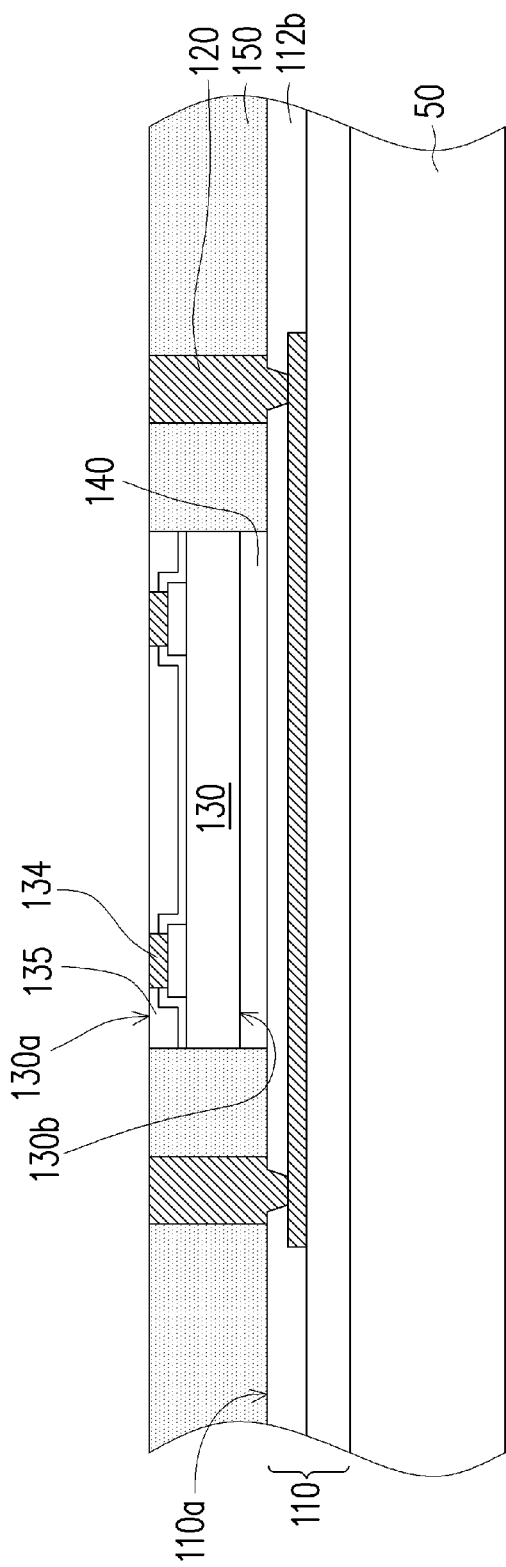

Referring to FIG. 1C, an encapsulant 150 is formed over the first surface 110a of the first redistribution layer 110 to encapsulate the chip 130, the die attach film 140, and the TIVs 120. In some embodiments, the encapsulant 150 includes a molding compound, a molding underfill, a resin or the like, such as epoxy. Other insulating material may be utilized as the encapsulant 150. The disclosure is not limited thereto. In some embodiments, the method of forming the encapsulant 150 may include at least the following steps. First, an insulating material (not shown) is formed on the dielectric layer 112b through, for example, a molding process to encapsulate the chip 130 and the TIVs 120. The conductive pillars 134 and the protection layer 135 of the chip 130 may be encapsulated by the insulating material. In other words, the conductive pillars 134 and the protection layer 135 of the chip 130 are not revealed by the insulating material. Thereafter, the insulating material can be grinded until the top surfaces of the conductive pillars 134 are exposed by the protection layer 135 and the insulating material, and the top surfaces of the TIVs 120 are exposed by the insulating material, such that the encapsulant 150 is formed. In some embodiments, the insulating material is grinded by a mechanical grinding process and/or a chemical mechanical polishing (CMP) process, or other suitable techniques. After grinding, the chip 130 has an active surface 130a opposite to the rear surface 130b. The exposed portion of the conductive pillars 134 is located on the active surface 130a of the chip 130.

Figure 1D:
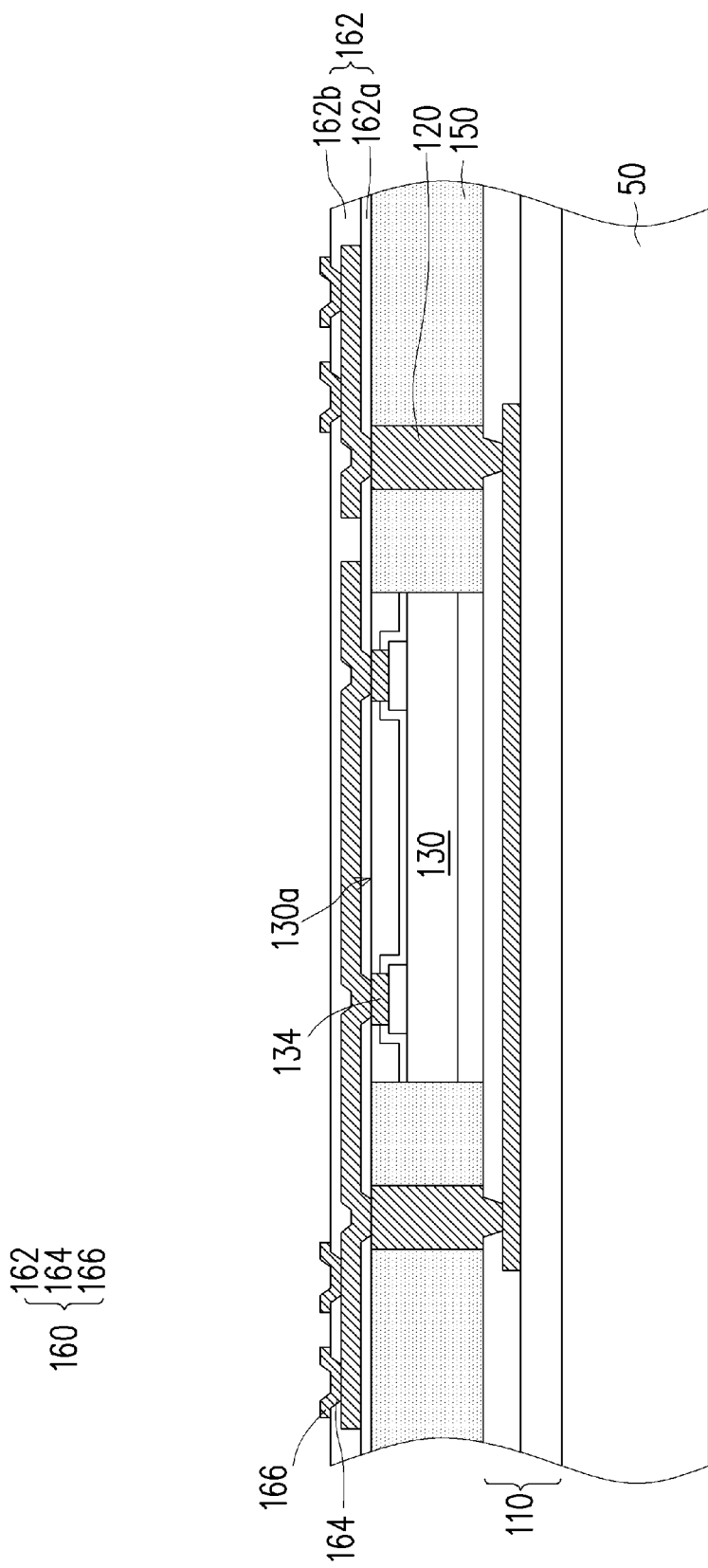

Referring to FIG. 1D, a second redistribution layer 160 is formed on the chip 130 and the encapsulant 150 and electrically connected to the chip 130 and the TIVs 120. As illustrated in FIG. 1D, the active surface 130a of the chip 130 faces the second redistribution layer 160. In some embodiments, the second redistribution layer 160 includes a second dielectric layer 162, a second conductive pattern layer 164, and an under ball metallurgy (UBM) layer 166. In some embodiments, the second dielectric layer may be constituted by dielectric layers 162a, 162b made of a same material. In some embodiments, the second dielectric layer 162 may include the same or similar material as that of the first dielectric layer 112. Similarly, the second conductive pattern layer 164 and the UBM layer 166 may include the same or similar material as that of the first conductive pattern layer 114. The second conductive pattern layer 164 is electrically connected to the conductive pillars 134 of the chip 130 and the TIVs 120 embedded in the encapsulant 150. In other words, the TIVs 120 electrically connect the first redistribution layer 110 and the second redistribution layer 160. In some embodiments, the topmost second conductive pattern layer 164 may be referred to as the UBM layer 166 for a ball mounting process. In some embodiments, when the second conductive pattern layer 164 is adapted to transmit signal from the chip 130 to the first redistribution layer 110 through the TIVs 120, the second conductive pattern layer 164 may be referred to as feed lines in the second redistribution layer 160. As illustrated in FIG. 1D, the dielectric layer 162a, the second conductive pattern layer 164, the dielectric layer 162b, and the UBM layer 166 are stacked in sequential order. However, this configuration construes no limitation in the present disclosure. In some alternative embodiments, more dielectric layers and/or more conductive patterns layers may be formed to stack alternately. In some embodiments, the second redistribution layer 160 may be referred to as a front side redistribution layer, and the first redistribution layer 110 may be referred to as a backside redistribution layer given the placements in the structure.

Figure 1E:
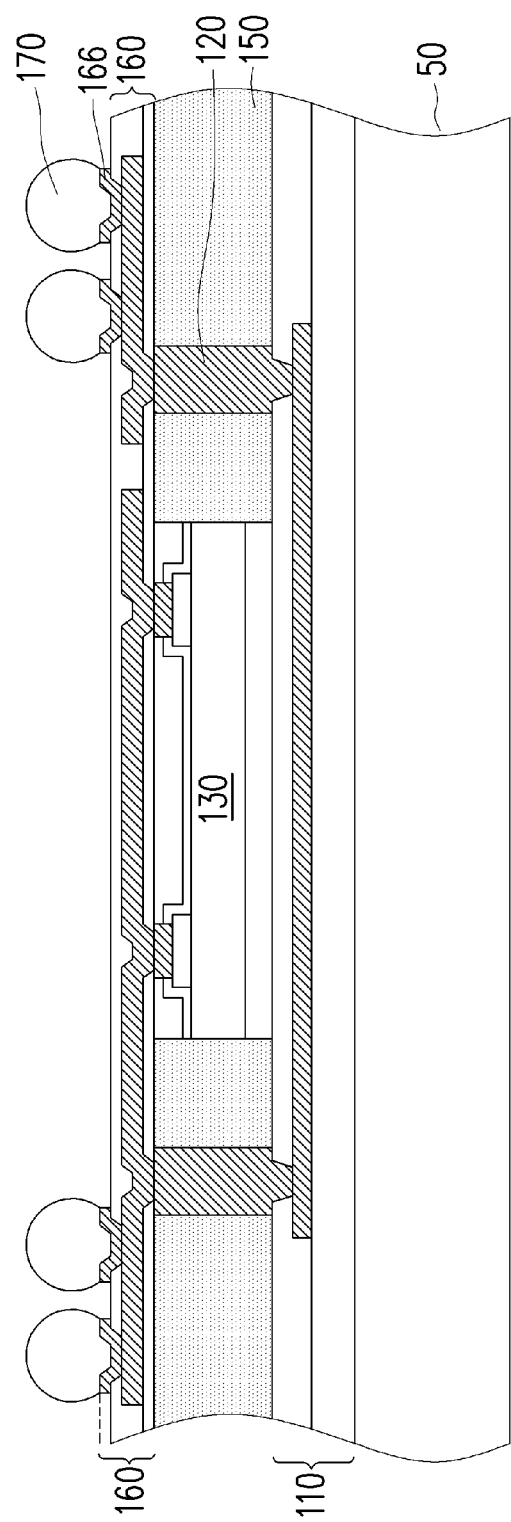

Referring to FIG. 1E, a plurality of conductive terminals 170 are formed on the second redistribution layer 160. In some embodiments, the conductive terminals 170 are attached to the UBM layer 166 through a solder flux (not shown). The conductive terminals 170 may include solder balls, ball grid array (BGA) balls, or C4 bumps, but is not limited thereto. In some embodiments, the conductive terminals 170 are made of a conductive material with low resistivity, such as Sn, Pb, Ag, Cu, Ni, Bi, or an alloy thereof. In some embodiments, the conductive terminals 170 may be disposed on the UBM layer 166 by a ball placement process and/or a reflow process.

Figure 1F:
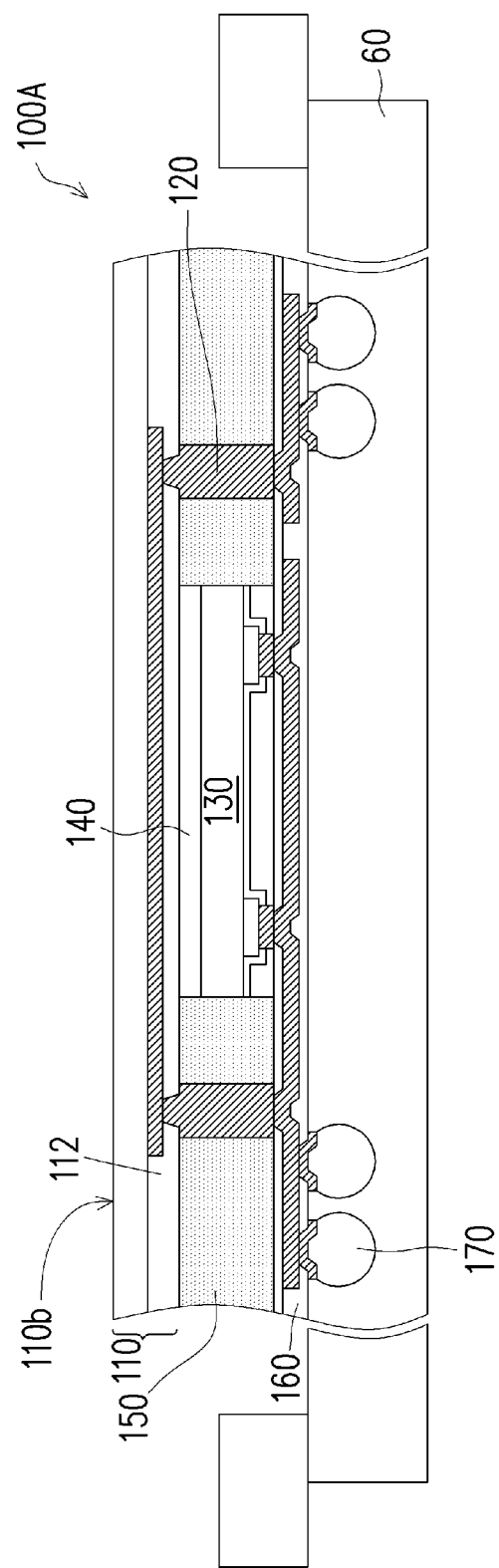

Referring to FIG. 1F, after the conductive terminals 170 are formed, the temporary carrier 50 may be separated from the second surface 110b of the first redistribution layer 110. In some embodiments, the de-bonding layer (not illustrated; e.g. LTHC release layer) may be irradiated by UV laser such that the dielectric layer 112 of the first redistribution layer 110 is de-bonded from the temporary carrier 50 Up to here, the manufacture of a chip package 100A is completed. In some embodiments, the chip package 100A may be referred to as an integrated fan-out (InFO) package. In some embodiments, the structure illustrated in FIG. 1E can be flipped upside down and attached to a tape 60 for further processing as illustrated in FIG. 1F.

Figure 2A:
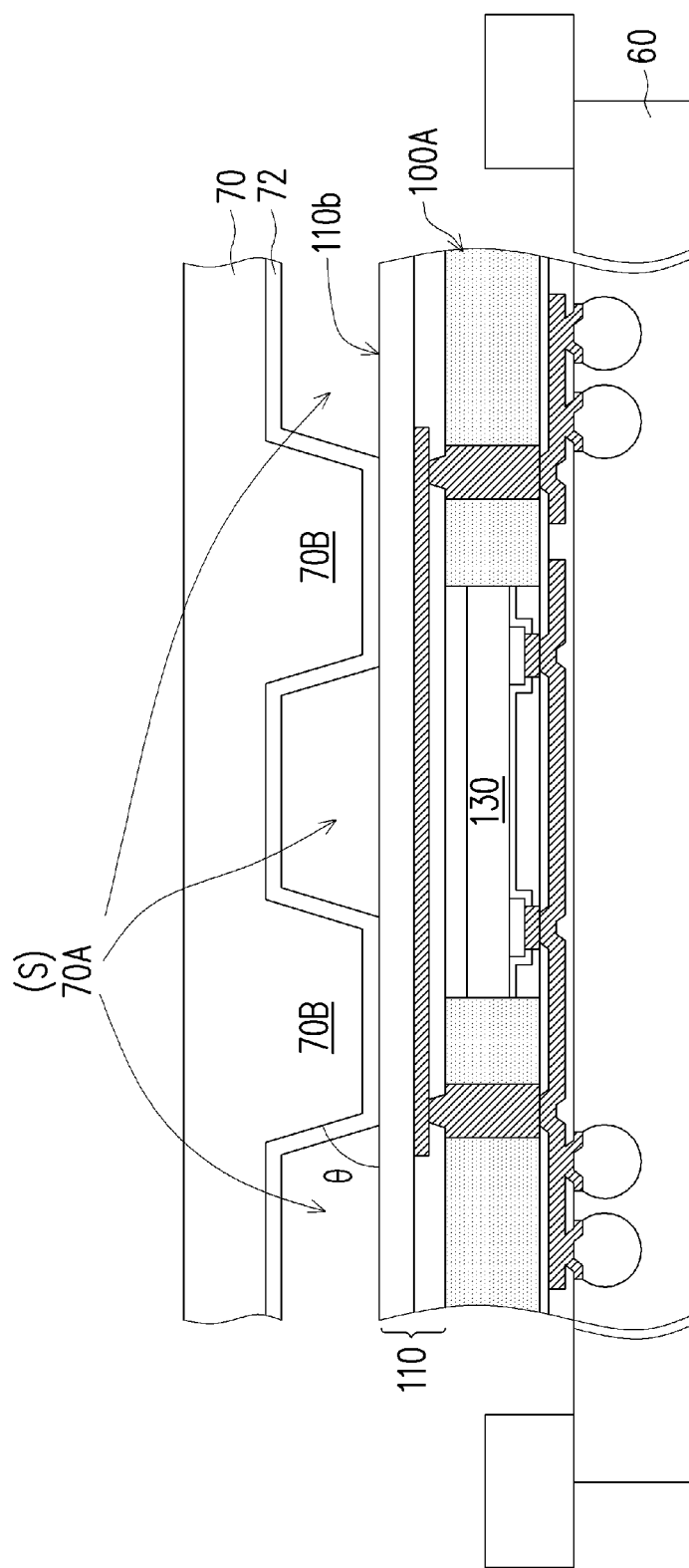
FIG. 2A to FIG. 2E are schematic cross-sectional views of various stages of manufacturing a semiconductor device in accordance with some exemplary embodiments of the disclosure.
Figure 2B:
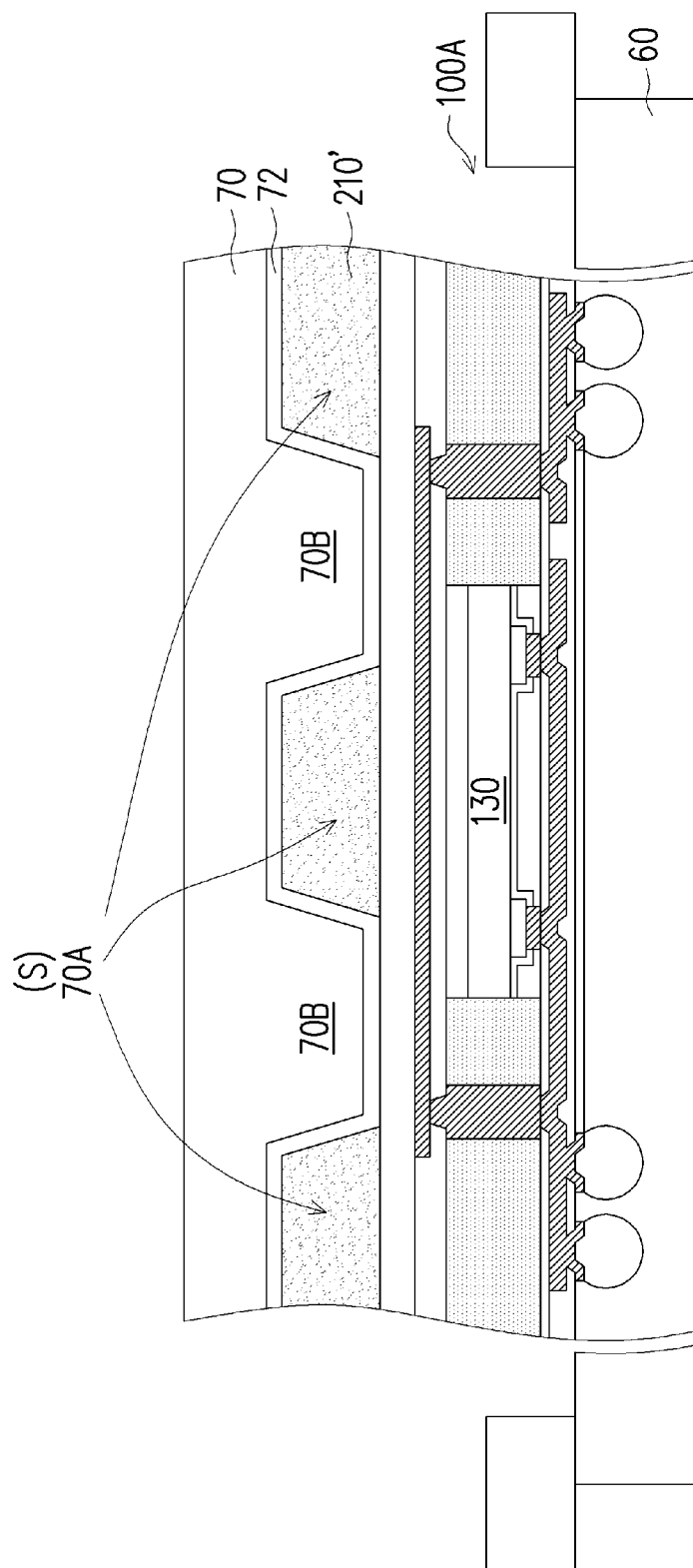
Figure 2C:
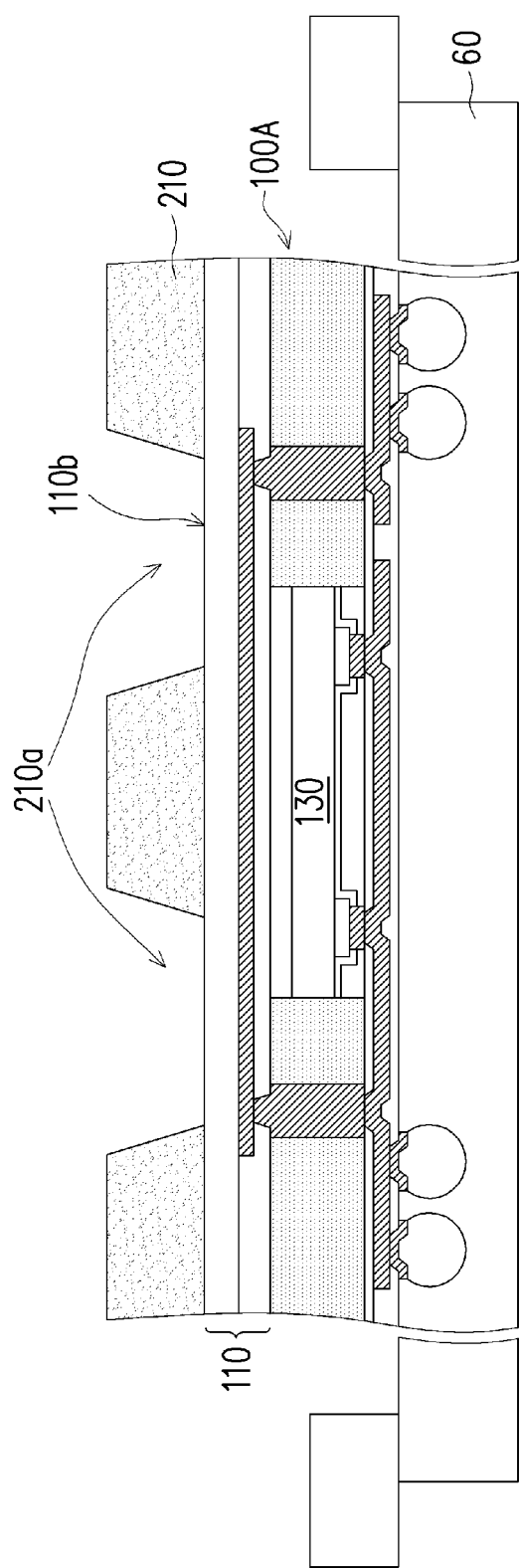
Figure 2D:
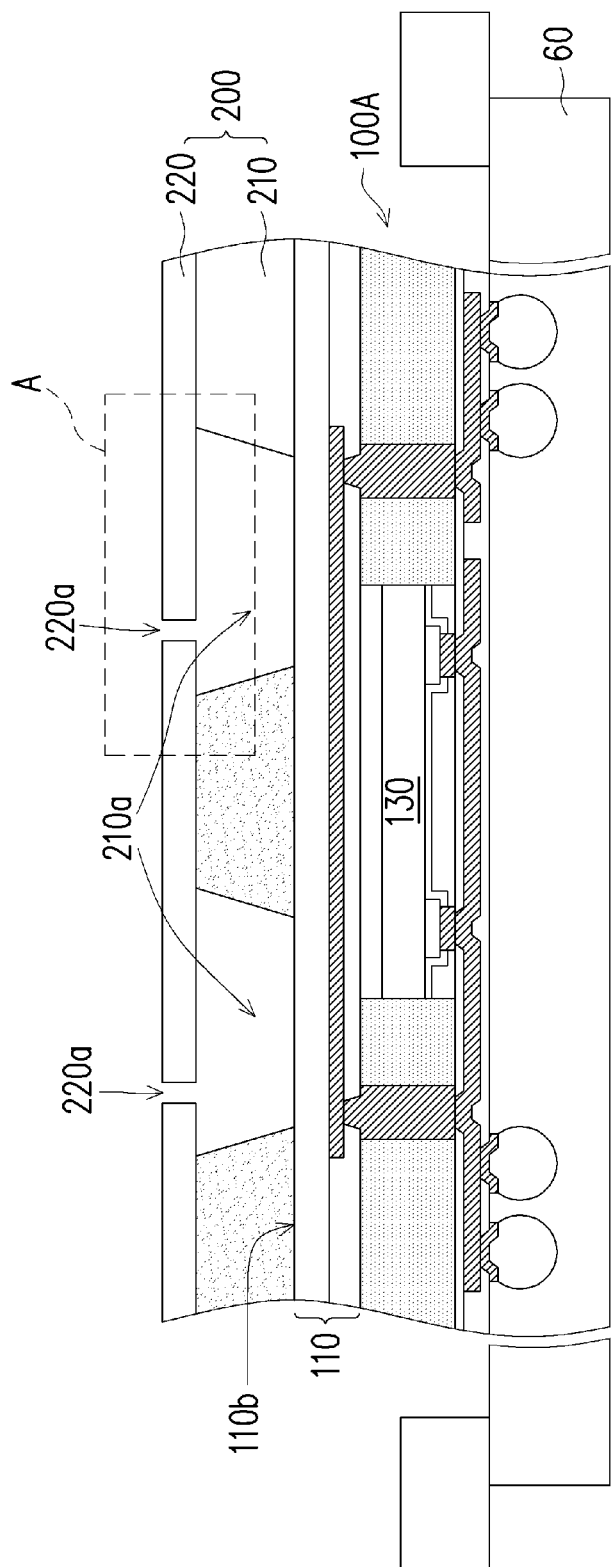
Figure 2E:
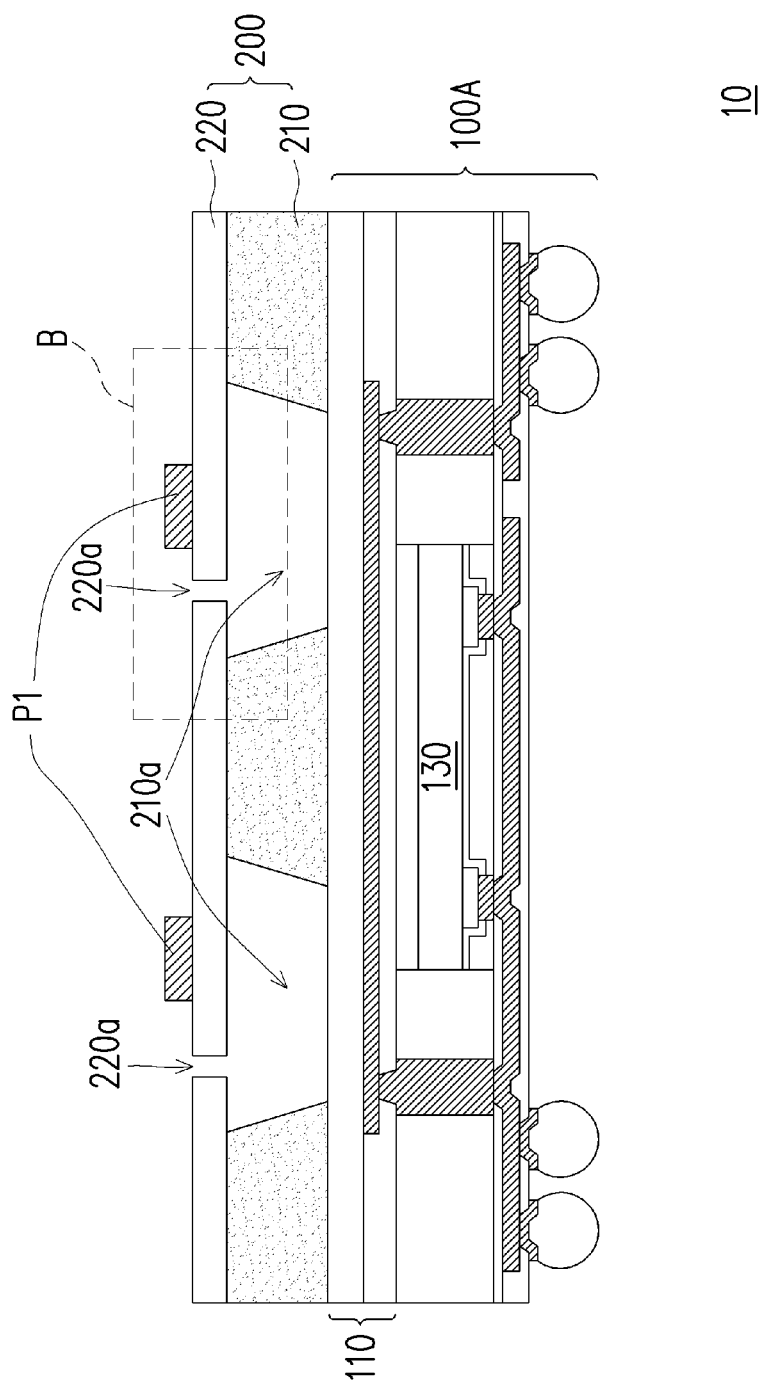
Figure 3B:
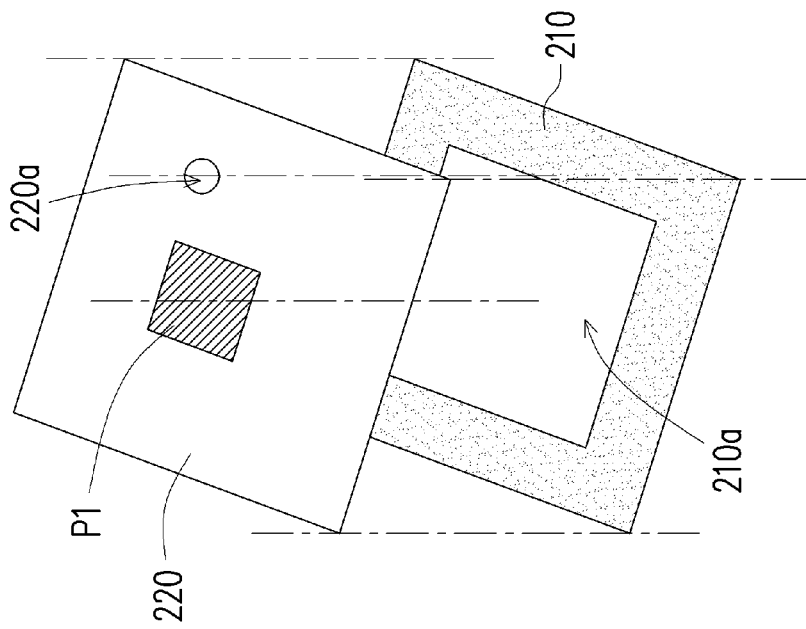
FIG. 3B is a schematic exploded perspective view illustrating the structure in the dashed box B depicted in FIG. 2E.
Figure 3A:
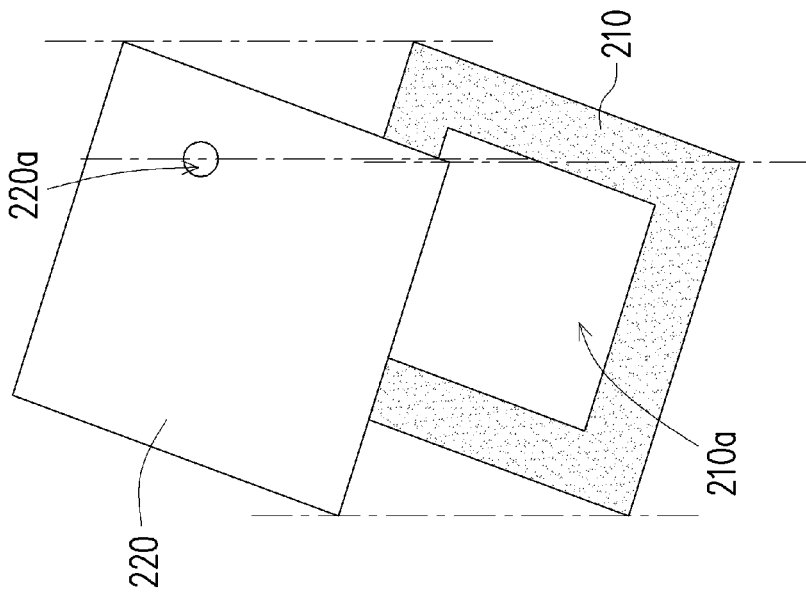
FIG. 3A is a schematic exploded perspective view illustrating the structure in the dashed box A depicted in FIG. 2D.

FIG. 2A to FIG. 2E are schematic cross-sectional views of various stages of manufacturing a semiconductor device in accordance with some exemplary embodiments of the disclosure, FIG. 3A is a schematic exploded perspective view illustrating the structure in the dashed box A depicted in FIG. 2D, and FIG. 3B is a schematic exploded perspective view illustrating the structure in the dashed box B depicted in FIG. 2E. The dot-dashed lines in FIG. 3A and FIG. 3B represent the corresponding locations between the two layers. First, referring to FIG. 2A, the chip package 100A is provided, and a molding chase 70 may be placed on the chip package 100A. For example, the tape 60 is configured at the side where the conductive terminals 170 are disposed, and the second surface 110b of the first redistribution layer 110 may be an outward facing surface for subsequent processing. The molding chase 70 placed on the chip package 100A may partially cover the chip package 100A. For example, the molding chase 70 may be provided with a concave portion 70A and a convex portion 70B connected to the concave portion 70A.

In some embodiments, after placing the molding chase 70 on the chip package 100A, the convex portion 70B is abutted to the chip package 100A, and the concave portion 70A of the molding chase 70 forms a space S between the molding chase 70 and the chip package 100A. In some alternative embodiments, after placing the molding chase 70, the convex portion 70B is not physically in contact with the chip package 100A, such that a gap may be between the molding chase 70 and the chip package 100A. In some embodiments, the convex portion 70B may include in a slanted or tapered sidewall to facilitate the release or disengagement from the chip package 100A during subsequent removal process. For example, after placing the molding chase 70 on the chip package 100A, an angle θ formed from the sidewall of the convex portion 70B extending to the second surface 110b of the first redistribution layer 110 may be an acute angle. In some alternative embodiments, the angle θ may be obtuse angle or right angle depending on the design requirements.

In some embodiments, the molding chase 70 includes a release layer 72. For example, the release layer 72 may be at least disposed on a surface of the convex portion 70B facing toward the chip package 100A. After placing the molding chase 70 on the chip package 100A, the release layer 72 on the convex portion 70B may be attached to the chip package 100A. In some embodiments, the release layer 72 is a buffer film. For example, the release layer 72 includes soft or elastic materials, adhesive materials, or other suitable materials to make contact with (or attach) the chip package 100A. In some embodiments, the release layer 72 can be provided to absorb mechanical stresses so as to prevent the chip package 100A from being damaged during subsequent processes. The release layer 72 may feature some material properties which can contribute to remove the molding chase 70 from the chip package 100A during the subsequent removal process. In some embodiments, the release layer 72 may be conformally disposed on the concave portion 70A and the convex portion 70B to facilitate the detachment from the chip package 100A and the subsequent formed structure. The configuration of the release layer 72 depends on the design requirement, and construes no limitation in the disclosure.

Referring to FIG. 2B, a molding material 210' is formed on the chip package 100A. For example, after placing the molding chase 70 on the chip package 100A, the molding material 210' is filled in the space S defined by the molding chase 70 and the chip package 100A. In some embodiments, the molding material 210' may be laterally injected to fill the concave portion 70A of the molding chase 70. In some embodiments, during the process, the molding chase 70 and the structure shown in FIG. 2B may be placed in a chamber, which may be a vacuumed environment such that the space S may be vacuumed. When the molding material 210' is injected into the space S, the vacuum in the space S may cause the molding material 210' to fill therein. The filling process of the molding material 210' may be referred to as a molding injection process. The molding material 210' may include a molding compound, a resin (e.g. epoxy or the like), an organic polymer, a polymer with or without a silica-based or glass filler added, or other suitable materials. In some embodiments, the molding material 210' is in a liquid form and flows. After the molding injection process, a curing process is optionally performed to solidify the molding material 210' through, for example, Ultra-Violet (UV) curing, thermal curing, or other suitable techniques.

Referring to FIG. 2C, after forming the molding material 210', the molding chase 70 is removed to form a molding layer 210 on the chip package 100A. After the removal of the molding chase 70, a cavity 210a is formed in the molding layer 210 as illustrated in FIG. 2C. The profile of the cavity 210a may correspondingly match the profile of the convex portion 70B of the molding chase 70. The shape of the cavity 210a may include a cylindrical, a circular truncated cone, a truncated pyramid, or a polyhedron, etc. It should be noted that the number, shape and size of the cavity 210a illustrated in FIG. 2C serves as an exemplary illustration, and the disclosure is not limited thereto. In some embodiments, the cavity 210a of the molding layer 210 may expose a portion of the second surface 110b of the first redistribution layer 110. In some alternative embodiments, the molding layer 210 substantially covers the second surface 110b of the first redistribution layer 110.

Referring to FIG. 2D and FIG. 3A, a dielectric layer 220 is formed on the molding layer 210, and the cavity 210a of the molding layer 210 is covered by the dielectric layer 220. The dielectric layer 220 may include a vent 220a. The dielectric layer 220 is formed by a suitable fabrication technique such as lamination, spin-coating, deposition, or the like. For example, a material of the dielectric layer 220 may include core material, pre-impregnated (prepreg) material, or other suitable materials. In some embodiments, the dielectric layer 220 may have a relatively low dielectric constant (Dk) ranging from about 2 to about 5, and a relatively low dissipation factor (Df) ranging from about 0.001 to about 0.01. In some embodiments, the dielectric layer 220 may be a dielectric film with a through hole, and the dielectric film may be attached on the molding layer 210 to cover the cavity 210a, such that the through hole of the dielectric film becomes the vent 220a in communication with the cavity 210a. In some embodiments, the cavity 210a is an air cavity, and the vent 220a is an air vent. In some alternative embodiments, the cavity 210a may be filled with gas or media in order to improve the performance, depending on the design requirements. In some embodiments, the cavity 210a and the vent 220a are located at the different layers such that the vent 220a may run through the dielectric layer 220 in a thickness direction to vent the cavity 210a. In some alternative embodiments, the number of the vent 220a can be more than one and/or configured to run through the dielectric layer 220 and the molding layer 210 to vent the cavity 210a in a multi-direction manner. In some embodiments, the vent 220a can release the vacuum within the cavity 210a and relieve the stress on the dielectric layer 220 and/or the molding layer 210.

As illustrated in FIG. 3A, the vent 220a of the dielectric layer 220 can be located close to the edge of the cavity 210a. In some alternative embodiments, the vent 220a may be located near the middle of the cavity 210a and/or on top of the cavity 210a and/or on the side of the cavity 210a, depending on the design requirements. The shape of the vent 220a in the cross section may include a square, a circle, polygon, or any other shape. The vent 220a may be made relatively small compared to the size of the cavity 210a, but consistent with adequate venting. For example, a ratio of the surface area of the dielectric layer 220 covered the cavity 210a to the maximum cross-sectional area of vent 220a ranges from 2000 to 50000 approximately. It should be noted that the number, shape and size of the vent 220a in FIG. 2D and FIG. 3A serves as an exemplary illustration, and the disclosure is not limited thereto.

After forming the dielectric layer 220 and the molding layer 210, a dielectric structure 200 is formed on the chip package 100A. In other words, the dielectric structure 200 includes the dielectric layer (i.e. first layer) 220 and the molding layer (i.e. second layer) 210, and the molding layer 210 is between the chip package 100A and the dielectric layer 220. The dielectric structure 200 has the cavity 210a and the vent 220a in open communication with the cavity 210a.

Referring to FIG. 2E and FIG. 3B, an antenna pattern P1 is formed on the dielectric layer 220 of the dielectric structure 200 opposite to the molding layer 210. For example, the antenna pattern P1 is located outside the cavity 210a. In other words, the cavity 210a of the dielectric structure 200 is disposed between the chip package 100A and the antenna pattern P1. For example, the antenna pattern P1 may be formed within the area where the dielectric layer 220 covers the cavity 210a, thereby facilitating antenna bandwidth enhancement. The dielectric layer 220 may be rigid enough to provide mechanical support for the antenna pattern P1. In some embodiments, the antenna pattern P1 may be formed on the area of the dielectric layer 220 without covering the vent 220a. In some embodiments, the antenna pattern P1 may be formed by forming a plurality of metallization patterns (not shown) through printing, plating, or other suitable processes. The material of the antenna pattern P1 may include aluminum, titanium, copper, nickel, tungsten, and/or alloys thereof. In some alternative embodiments, the antenna pattern P1 may be first formed on the dielectric film with through hole, afterwards, the dielectric film along with the antenna pattern P1 may be attached on the molding layer 210 to form the dielectric layer 220 and the antenna pattern P1 disposed thereon. In some embodiments, after forming the antenna pattern P1, the chip package 100A is electrically coupled to the antenna pattern P1. For example, the signal transmitted in the feed lines (e.g., in the first redistribution layer 110 and/or the second redistribution layer 160) of the chip package 100A may be electrically coupled to the antenna pattern P1 such that the antenna pattern P1 may be referred to as patch antennas.

After forming the antenna pattern P1, the tape 60 may be separated from the chip package 100A to obtain a semiconductor device 10. The semiconductor device 10 features the antenna pattern P1 on the dielectric layer 220 opposite to the cavity 210a, thereby achieving the performances such as wide bandwidth, high efficiency, etc. In some embodiments, the semiconductor device 10 may operate in the millimeter wave range, but is not limited thereto. The size of the cavity 210a in the semiconductor device 10 can be optimized based on the antenna impedance bandwidth so as to open the possibility to various product designs. The vent 220a of the dielectric structure 200 may facilitate the reliability enhancement for the cavity 210a.

Figure 4A:
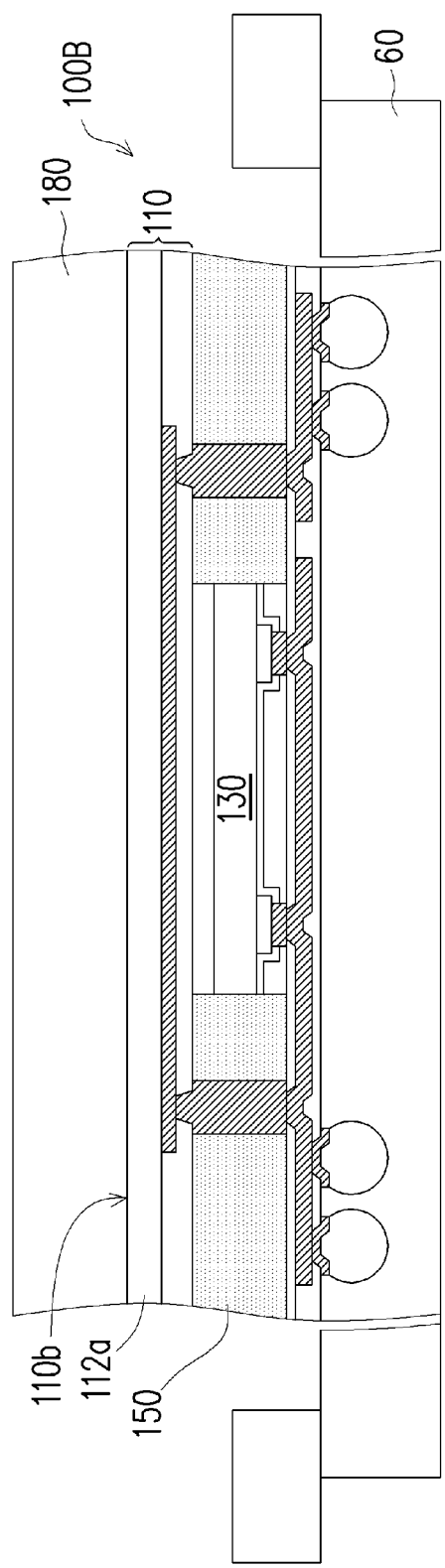
FIG. 4A to FIG. 4E are schematic cross-sectional views of various stages of manufacturing a semiconductor device in accordance with some exemplary embodiments of the disclosure.

FIG. 4A to FIG. 4E are schematic cross-sectional views of various stages of manufacturing a semiconductor device in accordance with some exemplary embodiments of the disclosure. Referring to FIG. 4A, a chip package 100B is provided. The chip package 100B of the embodiment is similar to the chip package 100A of FIG. 1F. The identical or similar numbers refer to the identical or similar elements throughout the drawings, and detail thereof is not repeated. The difference between the chip package 100B in FIG. 4A and the chip package 100A in FIG. 1F lies in that the chip package 100B includes an insulating layer 180 disposed on the second surface 110b of the first redistribution layer 110. For example, the insulating layer 180 located opposite to the encapsulant 150 may be formed over the dielectric layer 112a of the first redistribution layer 110 after the temporary carrier 50 is separated from the first redistribution layer 110, but is not limited thereto. In some alternative embodiments, the insulating layer 180 may be formed before forming the dielectric layer 112a of the first redistribution layer 110. The forming sequence of the insulating layer 180 in manufacturing the chip package 100B may depend on the design requirements.

In some embodiments, the insulating layer 180 is a polymer layer. For example, the insulating layer 180 includes a photo-sensitive material such as polybenzoxazole (PBO), polyimide, benzocyclobutene (BCB), a combination thereof, or the like. In some alternative embodiments, the insulating layer 180 includes epoxy resins or any other suitable type of molding materials. In some embodiments, the material of the insulating layer 180 may have low dielectric constant (Dk) and low dissipation factor (DO) properties. Depending on the frequency range of high-speed applications, suitable materials of the insulating layer 180 may be selected based on the required electrical properties of the designs. The insulating layer 180 may be formed by any suitable fabrication technique such as spin-coating, lamination, deposition or the like. In some embodiments, the insulating layer 180 may be employed to absorb stresses so as to prevent the underlying first redistribution layer 110 from being damaged during subsequent processes. For example, a thickness of the insulating layer 180 may range from 100 to 600 μm.

Figure 4B:
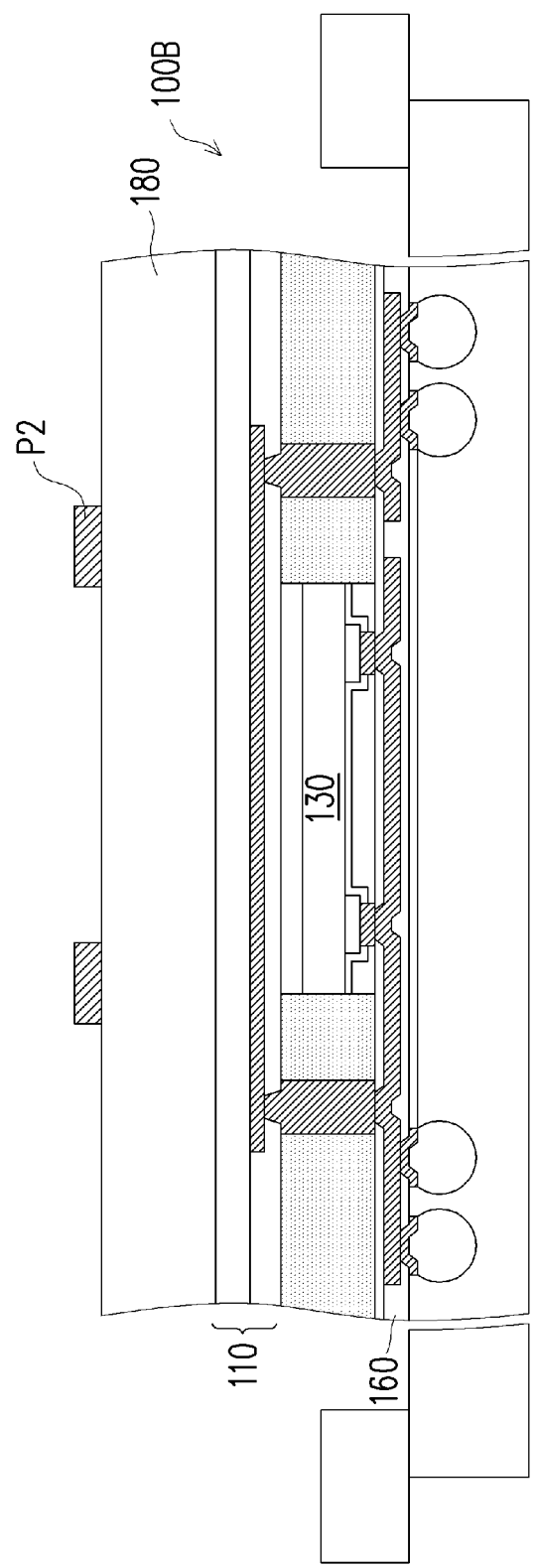

Referring to FIG. 4B, after providing the chip package 100B, an antenna pattern P2 may be formed on the insulating layer 180 of the chip package 100B. In some embodiments, the chip package 100B is electrically coupled to the antenna pattern P2. For example, the signal transmitted in the feed lines in the first redistribution layer 110 and/or the second redistribution layer 160 may be electrically coupled to the antenna pattern P2. In some embodiments, the antenna pattern P2 may be referred to as patch antennas. In some embodiments, the material of the antenna pattern P2 includes aluminum, titanium, copper, nickel, tungsten, and/or alloys thereof. For example, the antenna pattern P2 are formed by forming a metallization layer (not shown) through electroplating or deposition over the insulating layer 180 and then patterning the metallization layer by lithography and etching processes, or other suitable techniques. In some alternative embodiments, the antenna pattern P2 may be formed by forming a plurality of metallization patterns (not shown) directly through printing, plating, or other suitable techniques. However, the forming method of the antenna pattern P2 construes no limitation in the disclosure.

Figure 4C:
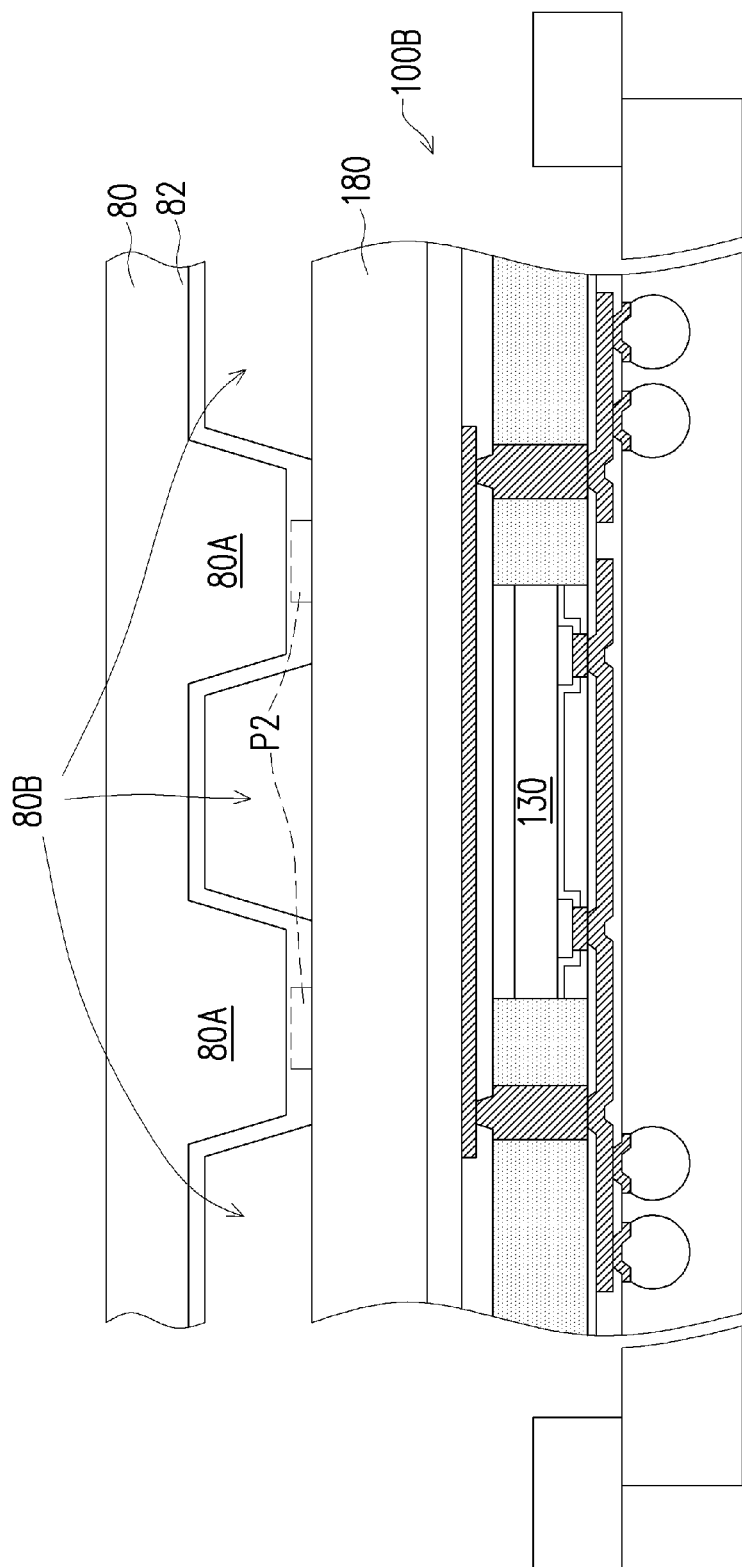

Referring to FIG. 4C, the molding chase 80 including the concave portion 80A and the convex portion 80B may be placed on the chip package 100B. The placing process of the molding chase 80 in the embodiment may be similar to that of the molding chase 70 in FIG. 2A, and the detailed descriptions are omitted for simplicity. In some embodiments, a contact surface of the convex portion 80B facing towards the chip package 100A 80 may be formed as a pattern substantially corresponding to the antenna pattern P2. After placing the molding chase 80, the release layer 82 on the convex portion 80B of the molding chase 80 may cover (or encapsulate) the antenna pattern P2 for protection. Accordingly, the antenna pattern P2 in FIG. 4C is illustrated as dashed.

Figure 4D:
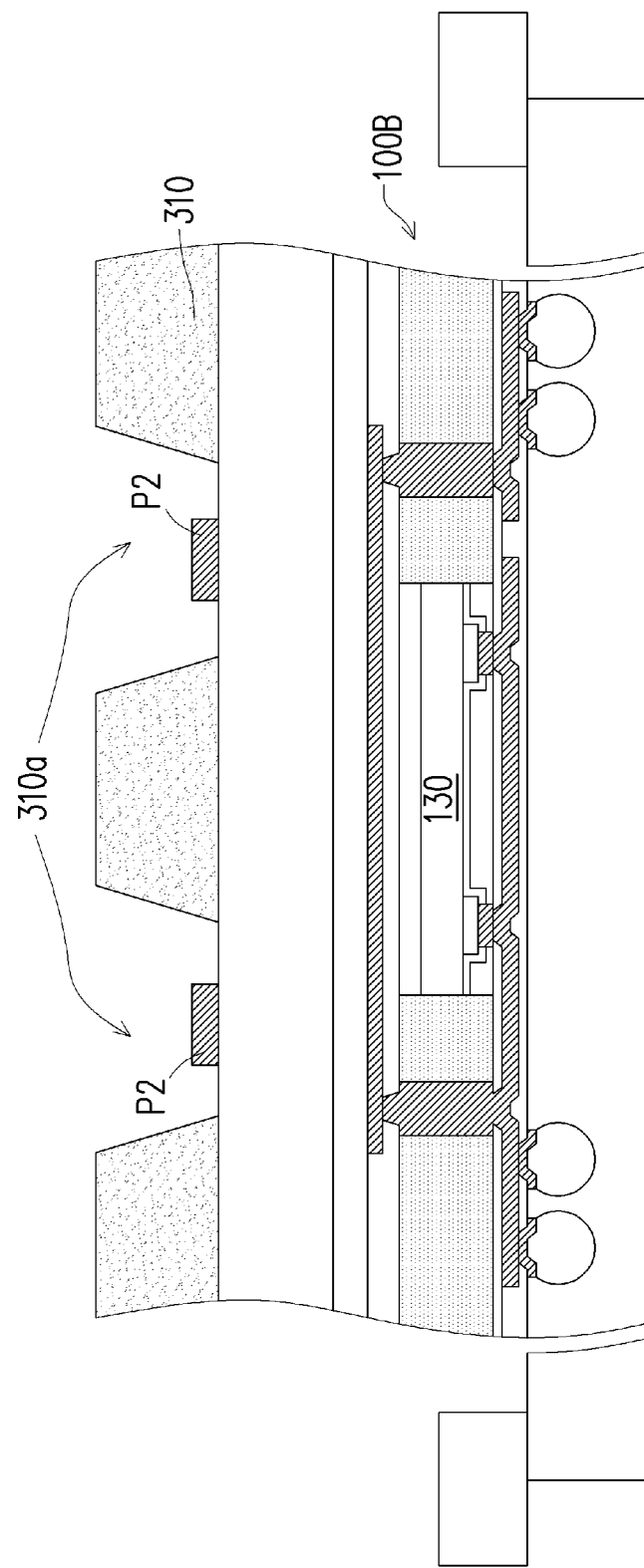

Referring to FIG. 4D, a molding layer 310 including a cavity 310a is formed on the chip package 100B. The material and the forming process of the molding layer 310 may be similar to that of the molding layer 210 illustrated in FIG. 2B and FIG. 2C, so the detailed descriptions are simplified. For example, the molding material may be first formed in the space defined by the molding chase 80 and the chip package 100B. At this stage, the release layer 82 on the convex portion 80B of the molding chase 80 encapsulates the antenna pattern P2 (shown in FIG. 4C), thereby preventing the antenna pattern P2 from being contaminated or damaged during the molding injection process. After the molding material is filled in the space, the molding chase 80 along with the release layer 82 can be removed to expose the antenna pattern P2 and form the molding layer 310 with the cavity 310a. Accordingly, the antenna pattern P2 is located on the insulating layer 180 of the chip package 100B and in the cavity 310a of the molding layer 310.

Figure 4E:
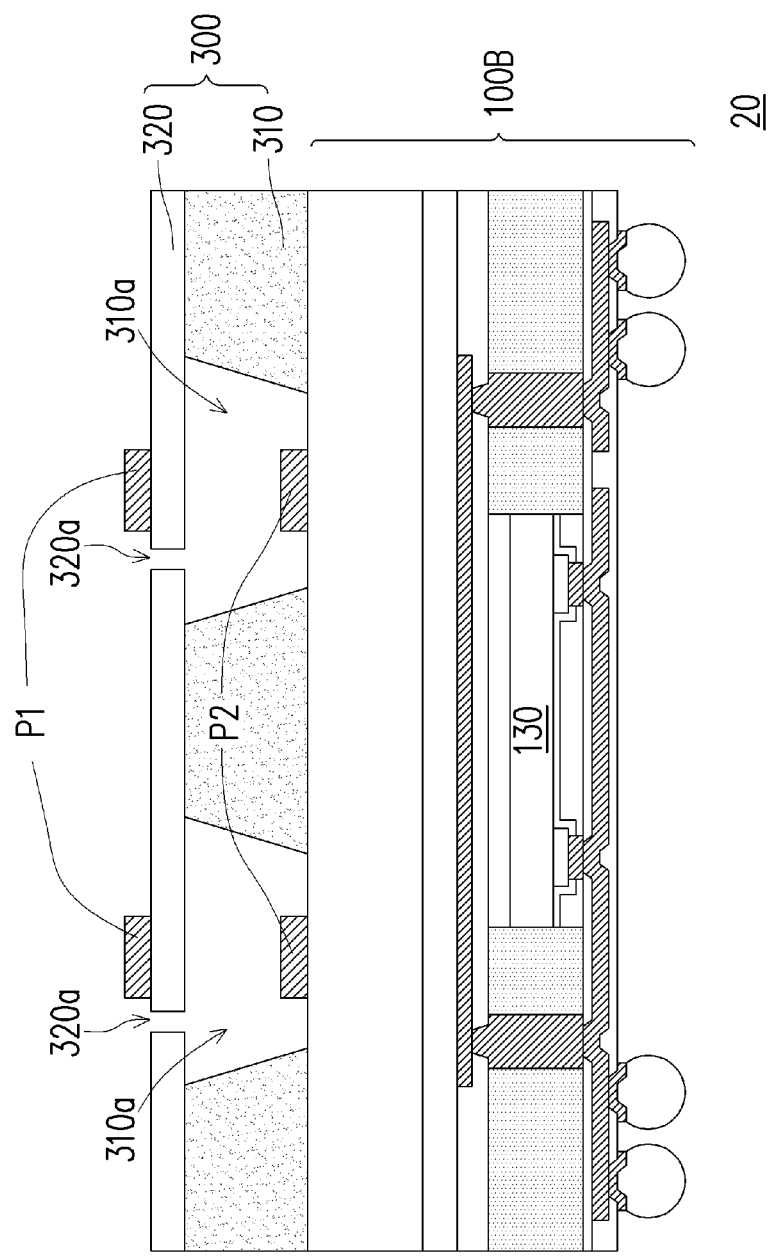

Referring to FIG. 4E, after forming the molding layer 310, the dielectric layer 320 including the vent 320a may be formed to cover the cavity 310a of the molding layer 310 so as to form a dielectric structure 300. In some embodiments, after forming the dielectric structure 300, the antenna pattern P1 is formed on the dielectric layer 320. In some alternative embodiments, the antenna pattern P1 may be first formed on the dielectric film with through hole, and then the dielectric film along with the antenna pattern P1 may be attached on the molding layer 310 and cover the cavity 310a to form the dielectric layer 320 and the antenna pattern P1 disposed thereon. The dielectric layer 320 and the antenna pattern P1 may be similar to the dielectric layer 220 illustrated in FIG. 2D and the antenna pattern P1 illustrated in FIG. 2E, and the detailed descriptions are omitted for brevity. The antenna pattern P1 on the dielectric structure 300 can be referred to as the first antenna pattern, and the antenna pattern P2 inside the cavity 310a can be referred to as the second antenna pattern. In some embodiments, the antenna pattern P1 and P2 may be referred to as a double patch antenna. After the antenna pattern P1 is formed on the dielectric structure 300, the tape 60 may be separated from the chip package 100B to form a semiconductor device 20. In some embodiments, the aforementioned steps may be performed at the wafer-level, and a singulation process may be performed on the resulting wafer-level structure using such as a laser cutting, mechanical sawing, or other suitable technique, to obtain a plurality of singulated semiconductor devices 20. In some embodiments, after singulating, the semiconductor device 20 can be mounted onto an electrical system (e.g., a package substrate, a printed circuit board, another semiconductor package, etc.) with the conductive terminals of the chip package connected therebetween, and the functionality of the semiconductor device 20 is made available to the other system components, but is not limited thereto. In some embodiments, the semiconductor device 20 includes antenna pattern P1 and P2 and other features described above, a wider bandwidth (e.g. about 57%) may be achieved.

Figure 5A:
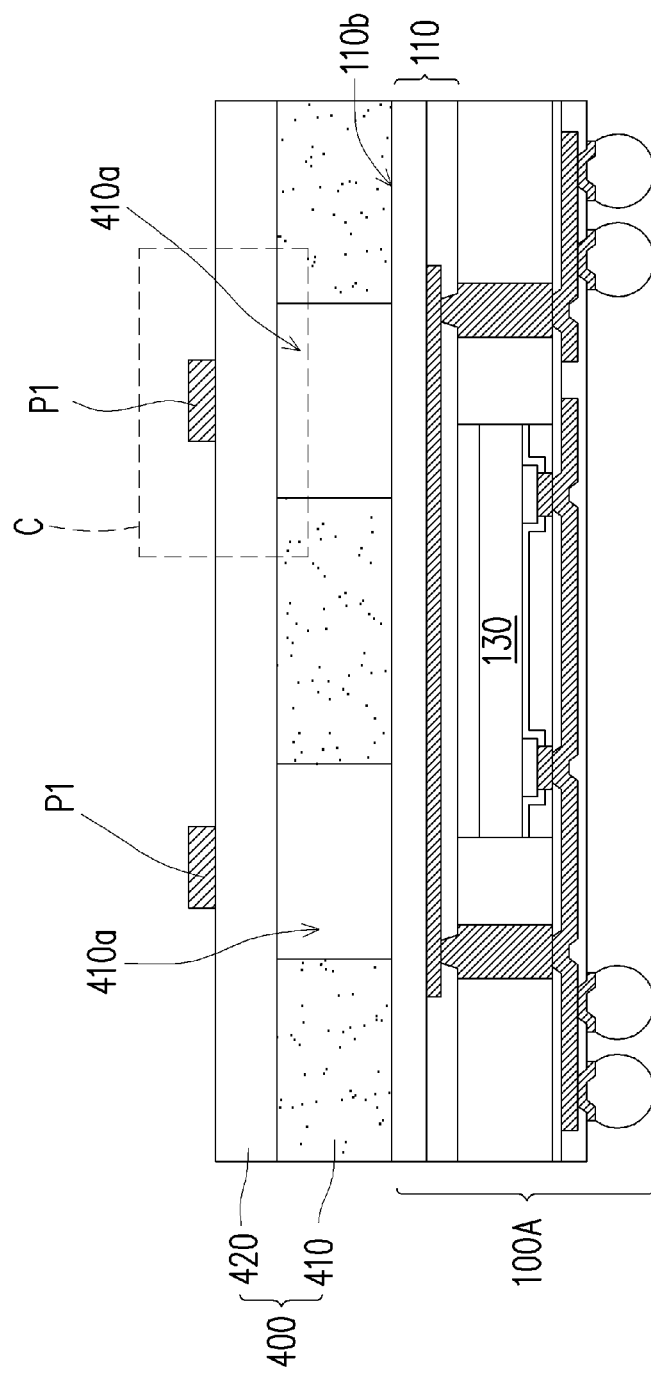
FIG. 5A is schematic cross-sectional views of a semiconductor device in accordance with some exemplary embodiments of the disclosure.
Figure 5B:
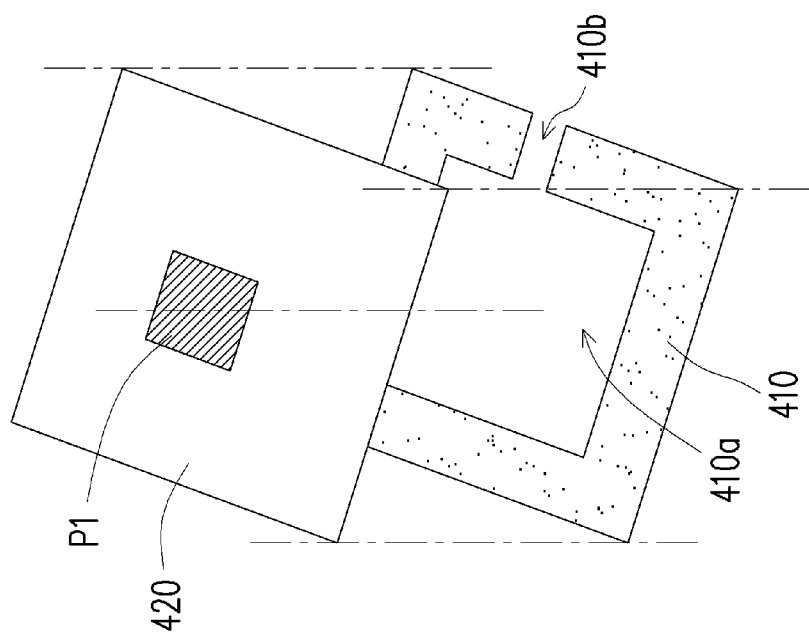
FIG. 5B is a schematic exploded perspective view illustrating the structure in the dashed box C depicted in FIG. 5A and the dashed box in depicted in FIG. 6.
Figure 6:
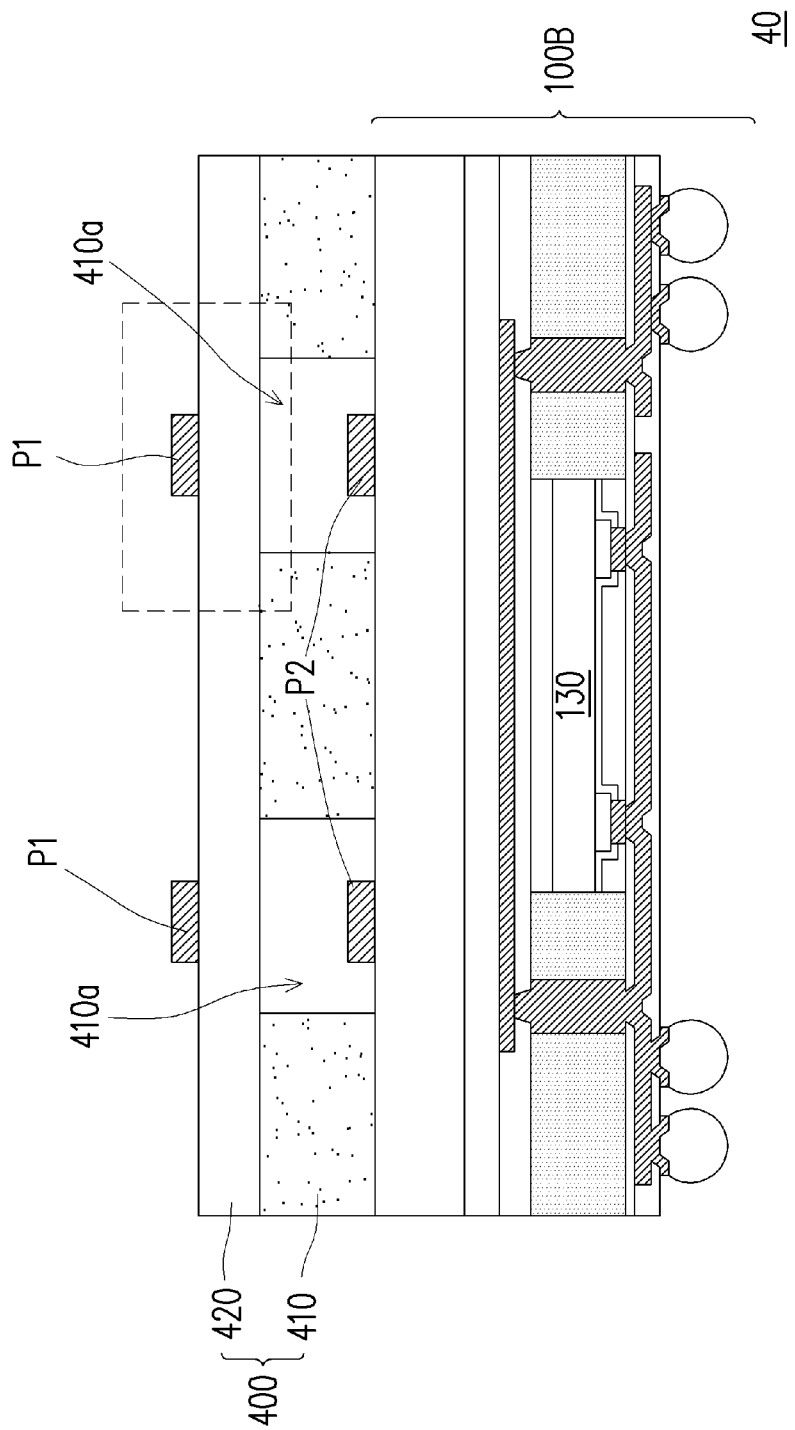
FIG. 6 is schematic cross-sectional views of a semiconductor device in accordance with some exemplary embodiments of the disclosure.

FIG. 5A is schematic cross-sectional views of a semiconductor device 30 in accordance with some exemplary embodiments of the disclosure, and FIG. 5B is a schematic exploded perspective view illustrating the structure in the dashed box C depicted in FIG. 5A and the dashed box in depicted in FIG. 6. The dot-dashed lines in FIG. 5B represent the corresponding locations between the two layers. FIG. 6 is schematic cross-sectional views of a semiconductor device 40 in accordance with some exemplary embodiments of the disclosure. Referring to FIG. 5A and FIG. 5B, the semiconductor device 30 of the embodiment is similar to the semiconductor device 10 illustrated in FIG. 2E. Referring to FIG. 6, the upper portion of the semiconductor device 40 of the embodiment (i.e. the dielectric structure 400 and the antenna pattern P1) may be similar to the semiconductor device 30 of FIG. 5A, and the lower portion of the semiconductor device 40 of the embodiment (i.e. the chip package 100B and the antenna pattern P2) may be similar to the semiconductor device 20 of FIG. 4E. The identical or similar numbers refer to the identical or similar elements throughout the drawings, and detail thereof is not repeated.

In some embodiments, the dielectric structure 400 of the semiconductor device 30 includes the first layer 420 and the second layer 410, and the second layer 410 may include the cavity 410a and the vent 410b. The antenna pattern P1 may be disposed on the first layer 420 opposite to the cavity 410a. In some embodiments, the sidewall of the second layer 410, which forms the boundary of the cavity 410a, may be substantially vertical with respect to the second surface 110b of the first redistribution layer 110 of the chip package 100A. In some alternative embodiments, the sidewall of the second layer 410 forming the boundary of the cavity 410a may be slanted or tapered, but is not limited thereto. For example, the vent 410b may be located on the side of the cavity 410a to provide lateral venting for the cavity 410a. In other words, that the vent 410b may run sideways through the second layer 410 to vent the cavity 410a. In some embodiment, the vent 410b may be formed as a trench, a notch or other suitable opening types. In some alternative embodiments, the number of the vent 410b can be more than one and/or configured to run through the first layer 420 and the second layer 410 to vent the cavity 410a in a multi-direction manner. It should be noted that the numbers, shapes and sizes of the vent 410b and the cavity 410a illustrated in FIG. 5A, FIG. 5B and FIG. 6 serve as an exemplary illustration, and the disclosure is not limited thereto.

According to some embodiments, a semiconductor device includes a chip package, a dielectric structure, and a first antenna pattern. The dielectric structure is disposed on the chip package and includes a cavity and a vent in communication with the cavity. The first antenna pattern is disposed on the dielectric structure, wherein the chip package is electrically coupled to the first antenna pattern, and the cavity of the dielectric structure is disposed between the chip package and the first antenna pattern.

According to some embodiments, a semiconductor device includes a chip package, a dielectric structure disposed on the chip package, and a first antenna pattern. The dielectric structure includes a dielectric layer and a molding layer interposed between the dielectric layer and the chip package. The first antenna pattern is disposed on the dielectric layer of the dielectric structure and corresponds to a cavity of the molding layer, where the chip package is electrically coupled to the first antenna pattern.

According to some embodiments, a semiconductor device includes a chip encapsulated by an encapsulant, a first redistribution layer disposed on the chip and the encapsulant and electrically coupled to the chip, a molding layer disposed over the first redistribution layer and located opposite to the chip and the encapsulant, a dielectric layer overlying the molding layer and located opposite to the first redistribution layer, and a first antenna pattern overlying the dielectric layer and located opposite to the cavity of the molding layer. The dielectric layer covers a cavity of the molding layer. The chip is electrically coupled to the first antenna pattern.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor device, comprising:
    a chip package;
    a dielectric structure disposed on the chip package, the dielectric structure comprising a first layer, a second layer disposed between the chip package and the first layer and comprising a cavity, and a vent in communication with the cavity, wherein the first layer covers the cavity, wherein the vent is an air vent; and
    a first antenna pattern disposed on the dielectric structure, wherein the chip package is electrically coupled to the first antenna pattern, and the cavity of the dielectric structure is disposed between the chip package and the first antenna pattern.

2. The semiconductor device according to claim 1, further comprising:
    a second antenna pattern disposed inside the cavity of the dielectric structure, wherein the chip package is electrically coupled to the second antenna pattern.

3. The semiconductor device according to claim 2, wherein the first antenna pattern is disposed on the first layer of the dielectric structure and right above the second antenna pattern.

4. The semiconductor device according to claim 1, wherein the first antenna pattern is disposed on the first layer and located outside the cavity.

5. The semiconductor device according to claim 1, wherein the vent is at the first layer or at the second layer.

6. The semiconductor device according to claim 1, wherein the chip package comprises:
    a chip;
    an encapsulant encapsulating the chip; and
    a redistribution layer disposed on the chip and the encapsulant and electrically connected to the chip.

7. The semiconductor device according to claim 6, wherein the chip package further comprises an insulating layer disposed on the redistribution layer and located opposite to the encapsulant, the semiconductor device comprises a second antenna pattern disposed on the insulating layer, and the chip package is electrically coupled to the second antenna pattern.

8. A semiconductor device, comprising:
    a chip package;
    a dielectric structure disposed on the chip package and comprising:
        a dielectric layer; and
        a molding layer interposed between the dielectric layer and the chip package; and
    a first antenna pattern disposed on the dielectric layer of the dielectric structure and corresponding to a cavity of the molding layer, wherein the chip package is electrically coupled to the first antenna pattern.

9. The semiconductor device according to claim 8, wherein a through hole of the dielectric layer is in communication with the cavity of the molding layer, and the first antenna pattern is disposed next to the through hole.

10. The semiconductor device according to claim 8, wherein the molding layer of the dielectric structure is in physical contact with a redistribution layer of the chip package.

11. The semiconductor device according to claim 8, further comprising:
a second antenna pattern disposed on an insulating layer of the chip package, located within the cavity of the molding layer of the dielectric structure, and electrically coupled to the chip package.

12. The semiconductor device according to claim 8, wherein the chip package comprises:
a chip;
an encapsulant encapsulating the chip; and
a redistribution layer disposed on the chip and the encapsulant and electrically connected to the chip, wherein the molding layer of the dielectric structure is disposed over the redistribution layer of the chip package and opposite to the encapsulant.

13. The semiconductor device according to claim 8, wherein the cavity of the molding layer is tapered toward the chip package.

14. The semiconductor device according to claim 8, wherein a vent runs sideways through the molding layer to vent the cavity.

15. A semiconductor device, comprising:
a chip encapsulated by an encapsulant;
a first redistribution layer disposed on the chip and the encapsulant and electrically coupled to the chip;
a molding layer disposed over the first redistribution layer and located opposite to the chip and the encapsulant;
a dielectric layer overlying the molding layer and located opposite to the first redistribution layer, the dielectric layer covering a cavity of the molding layer; and
a first antenna pattern overlying the dielectric layer and located opposite to the cavity of the molding layer, wherein the chip is electrically coupled to the first antenna pattern.

16. The semiconductor device according to claim 15, wherein a through hole of the dielectric layer is in communication with the cavity of the molding layer, and the first antenna pattern is disposed next to the through hole.

17. The semiconductor device according to claim 15, further comprising:
a polymer layer interposed between the first redistribution layer and the molding layer; and
a second antenna pattern overlying the polymer layer, located within the cavity of the molding layer, and electrically coupled to the chip.

18. The semiconductor device according to claim 15, further comprising:
a second redistribution layer in contact with an active surface of the chip, wherein a back surface of the chip is attached to the first redistribution layer; and
a through molding via penetrating through the encapsulant, wherein the chip is electrically coupled to the first redistribution layer through the second redistribution layer and the through molding via.

19. The semiconductor device according to claim 15, wherein the cavity of the molding layer is tapered toward the first redistribution layer.

20. The semiconductor device according to claim 15, wherein a lateral vent of the molding layer is in communication with the cavity of the molding layer.

* * * * *